(12) United States Patent
Yu et al.

(10) Patent No.: US 9,455,404 B2
(45) Date of Patent: Sep. 27, 2016

(54) MEMORY DEVICE AND METHOD OF MANUFACTURING THE SAME

(71) Applicant: MACRONIX International Co., Ltd., Hsinchu (TW)

(72) Inventors: Bing-Lung Yu, Hsinchu (TW); Chin-Tsan Yeh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1 day.

(21) Appl. No.: 14/590,545

(22) Filed: Jan. 6, 2015

(65) Prior Publication Data

US 2016/0197272 A1 Jul. 7, 2016

(51) Int. Cl.
*H01L 45/00* (2006.01)
(52) U.S. Cl.
CPC .......... *H01L 45/1253* (2013.01); *H01L 45/06* (2013.01); *H01L 45/1608* (2013.01)
(58) Field of Classification Search
CPC .... H01L 45/06; H01L 45/1233; H01L 45/16

USPC ................................. 257/3, 4, 751
See application file for complete search history.

(56) References Cited

U.S. PATENT DOCUMENTS 5,536,947 A * 7/1996 Klersy ................ G11C 11/56
257/2

* cited by examiner

*Primary Examiner* — Mark Prenty
(74) *Attorney, Agent, or Firm* — J.C. Patents

(57) ABSTRACT

A memory device is provided. A first conductive layer, a first diffusion barrier layer, a phase change layer, a second diffusion barrier layer and a second conductive layer are disposed on a first electrode layer in sequence to form a stacking structure. A dielectric layer is disposed on the first electrode layer and covers a sidewall of the stacking structure and part of a top surface of the second conductive layer. A second electrode layer is disposed on the dielectric layer and the second conductive layer. Barrier enhancing components are provided between a bottom surface of the first diffusion barrier layer and a top surface of the second diffusion barrier layer. Further, a method of manufacturing a memory device is provided.

10 Claims, 5 Drawing Sheets

MEMORY DEVICE AND METHOD OF MANUFACTURING THE SAME

BACKGROUND OF THE INVENTION

1. Field of the Invention

The present invention generally relates to a memory device and a method of manufacturing the same.

2. Description of Related Art

With the continuous progressing and evolution of the semiconductor technology, the manufacturing process of memory devices also strides forward. Due to the advantages of small volume, low power consumption, high read/write speed and high capacity density, a phase change memory device is considered as one of the memory devices that are developed with great efforts currently.

Generally, the phase change memory device includes conductive layers which directly contact the phase change material, and metals (such as tungsten) in the conductive layers may be diffused into the phase change material. At this time, the reliability of the phase change memory device might be seriously affected. Therefore, how to improve the reliability of the phase change memory device, caused by the unexpected metal diffusion into the phase change material, is an important issue that needs to be overcome.

SUMMARY OF THE INVENTION

The invention provides a memory device, wherein diffusion barrier layers with barrier enhancing components are disposed between the conductive layers and the phase change layer to effectively prevent the unexpected metal diffusion from the conductive layers into the phase change material, thereby enhancing the reliability of the memory device.

The invention provides a memory device that includes the following. A first conductive layer, a first diffusion barrier layer, a phase change layer, a second diffusion barrier layer and a second conductive layer are disposed on a first electrode layer in sequence to form a stacking structure. A dielectric layer is disposed on the first electrode layer and covering a sidewall of the stacking structure and part of a top surface of the second conductive layer. A second electrode layer is disposed on the dielectric layer and the second conductive layer. Barrier enhancing components are provided between a bottom surface of the first diffusion barrier layer and a top surface of the second diffusion barrier layer.

In an embodiment of the invention, the barrier enhancing components are different from constituent elements of the first diffusion barrier layer and the second diffusion barrier layer.

In an embodiment of the invention, the barrier enhancing components include oxygen element, nitrogen element, helium element or hydrogen element.

In an embodiment of the invention, the barrier enhancing components are provided on grain boundaries of the first diffusion barrier layer, grain boundaries of the second diffusion barrier layer, the bottom surface of the first diffusion barrier layer, a top surface of the first diffusion barrier layer, a bottom surface of the second diffusion barrier layer, the top surface of the second diffusion barrier layer or a combination thereof.

In an embodiment of the invention, the barrier enhancing components are contained in a barrier enhancing layer on the bottom surface of the first diffusion barrier layer, a top surface of the first diffusion barrier layer, a bottom surface of the second diffusion barrier layer, the top surface of the second diffusion barrier layer or a combination thereof.

In an embodiment of the invention, the barrier enhancing layer includes oxygen element, nitrogen element, helium element or hydrogen element.

In an embodiment of the invention, the first diffusion barrier layer and the second diffusion barrier layer respectively include Ti, Ta, TiN, TaN or a combination thereof.

In an embodiment of the invention, the memory device further includes an insulation layer disposed on the first diffusion barrier layer. An opening is in the insulation layer, and the phase change layer covers the insulation layer and fills the opening.

The invention further provides a method of manufacturing a memory device that includes the following. A first conductive layer, a first diffusion barrier layer, a phase change layer, a second diffusion barrier layer and a second conductive layer are formed in sequence on a first electrode layer to form a stacking structure. Barrier enhancing components are provided to the stacking structure, so that the barrier enhancing components are provided between a bottom surface of the first diffusion barrier layer and a top surface of the second diffusion barrier layer. A dielectric layer is formed on the first electrode layer. The dielectric layer covers a sidewall of the stacking structure and part of a top surface of the second conductive layer. A second electrode layer is formed on the dielectric layer and the second conductive layer.

In an embodiment of the invention, the barrier enhancing components are different from constituent elements of the first diffusion barrier layer and the second diffusion barrier layer.

In an embodiment of the invention, the barrier enhancing components include oxygen element, nitrogen element, helium element or hydrogen element.

In an embodiment of the invention, the barrier enhancing components are provided on grain boundaries of the first diffusion barrier layer, grain boundaries of the second diffusion barrier layer, the bottom surface of the first diffusion barrier layer, a top surface of the first diffusion barrier layer, a bottom surface of the second diffusion barrier layer, the top surface of the second diffusion barrier layer or a combination thereof.

In an embodiment of the invention, the barrier enhancing components are contained in a barrier enhancing layer on the bottom surface of the first diffusion barrier layer, a top surface of the first diffusion barrier layer, a bottom surface of the second diffusion barrier layer, the top surface of the second diffusion barrier layer or a combination thereof.

In an embodiment of the invention, the first diffusion barrier layer and the second diffusion barrier layer are formed and the barrier enhancing components are provided in an in-situ manner.

In an embodiment of the invention, the first diffusion barrier layer and the second diffusion barrier layer are formed and the barrier enhancing components are provided in an ex-situ manner.

In an embodiment of the invention, the barrier enhancing components are provided by performing a rapid thermal oxidation process, an oxygen plasma process, or a furnace oxidation process.

In an embodiment of the invention, the first diffusion barrier layer and the second diffusion barrier layer respectively include Ti, Ta, TiN, TaN or a combination thereof.

In an embodiment of the invention, the method of manufacturing the memory device further includes forming an insulation layer on the first diffusion barrier layer. An opening is formed in the insulation layer, and the phase change layer covers the insulation layer and fills the opening.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
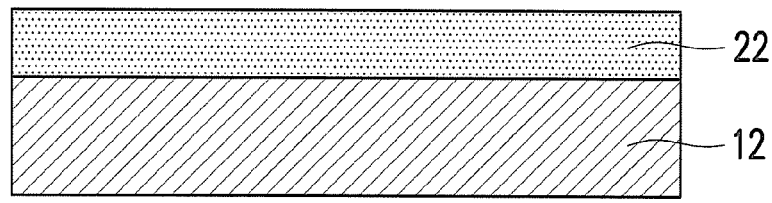
FIG. 1A to FIG. 1J are schematic cross-sectional views illustrating a manufacturing process of a memory device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1J are schematic cross-sectional views illustrating a manufacturing process of a memory device according to an embodiment of the invention.

With reference to FIG. 1A, an electrode layer 12 is provided. A material of the electrode layer 12 is metal material, such as tungsten, aluminium, copper or platinum. A method of forming the electrode layer 12 includes atomic layer deposition (ALD), for example. In an embodiment of the invention, a thickness of the electrode layer 12 may be 25 angstrom to 10000 angstrom. Then, a conductive material layer 22 is formed on the electrode layer 12. A material of the conductive material layer 22 is W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW or WON, for example. A method of forming the conductive material layer 22 includes chemical vapor deposition (CVD), metal organic chemical vapor deposition (MOCVD), physical vapor deposition (PVD) or ALD, for example. In an embodiment of the invention, a thickness of the conductive material layer 22 may be 25 angstrom to 10000 angstrom.

Figure 1B:
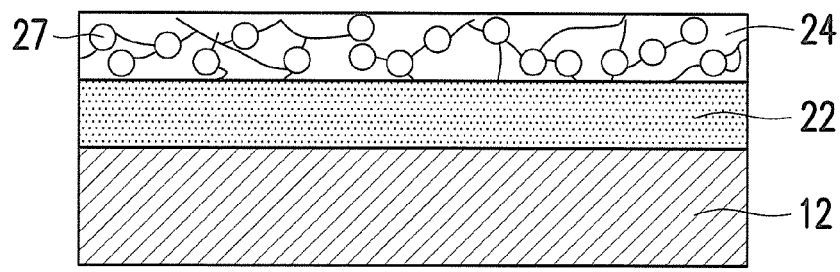

With reference to FIG. 1B, a diffusion barrier material layer 24 is formed on the conductive material layer 22. A material of the diffusion barrier material layer 24 is Ti, Ta, TiN, TaN or a combination thereof, for example. A method of forming the diffusion barrier material layer 24 includes CVD, MOCVD, PVD or ALD, for example. In an embodiment of the invention, a thickness of the diffusion barrier material layer 24 may be 25 angstrom to 2000 angstrom.

With reference to FIG. 1B, barrier enhancing components 27 are provided to the diffusion barrier material layer 24. The barrier enhancing components 27 are different from constituent elements of the diffusion barrier material layer 24. The barrier enhancing components 27 may include oxygen element, nitrogen element, helium element or hydrogen element. In an embodiment, the barrier enhancing components 27 are provided into grain boundaries of the diffusion barrier material layer 24. In another embodiment, the barrier enhancing components 27 may be provided on a bottom surface of the diffusion barrier material layer 24, on a top surface of the diffusion barrier material layer 24 or a combination thereof. The barrier enhancing components 27 in the grain boundaries of the diffusion barrier material layer 24 in FIG. 1B are shown for illustrative purpose, but the invention is not limited thereto. In another embodiment, the barrier enhancing components 27 are provided and react with the diffusion barrier material layer 24 to form a barrier enhancing layer (not illustrated) on the bottom surface of the diffusion barrier material layer 24, on the top surface of the diffusion barrier material layer 24 or a combination thereof. In other words, the barrier enhancing components 27 may be contained in the barrier enhancing layer on the bottom surface of the diffusion barrier material layer 24, on the top surface of the diffusion barrier material layer 24 or a combination thereof. The barrier enhancing layer may include oxygen element, nitrogen element, helium element or hydrogen element. A method of providing the barrier enhancing components 27 may be a rapid thermal oxidation process (RTP), an oxygen plasma process, or a furnace oxidation process. The barrier enhancing components 27 may be provided using an oxygen-based gas. The oxygen-based gas is an $O_2$ gas, an $N_2O$ gas, an $H_2O$ gas, an $O_3$ gas or a mixture of an $O_2$ gas and an $H_2$ gas, for example. It is worth noting that the diffusion barrier material layer 24 may be formed and the barrier enhancing components 27 may be provided in an in-situ manner (performed in the same chamber) or an ex-situ manner. The barrier enhancing components 27 are able to enhance the barrier ability of the diffusion barrier material layer 24.

Figure 1C:
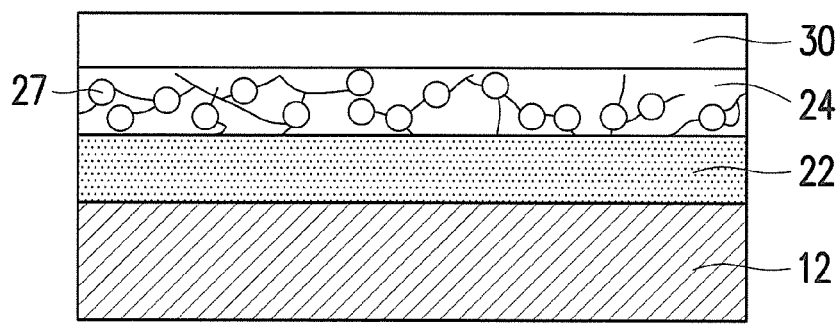

With reference to FIG. 1C, an insulation material layer 30 is formed on the diffusion barrier material layer 24. A material of the insulation material layer 30 is silicon oxide, phosphosilicate glass, borophosphosilicate glass or a combination thereof, for example. A method of forming the insulation material layer 30 includes CVD, for example. In an embodiment of the invention, a thickness of the insulation material layer 30 is 500 angstrom to 20000 angstrom.

Figure 1D:
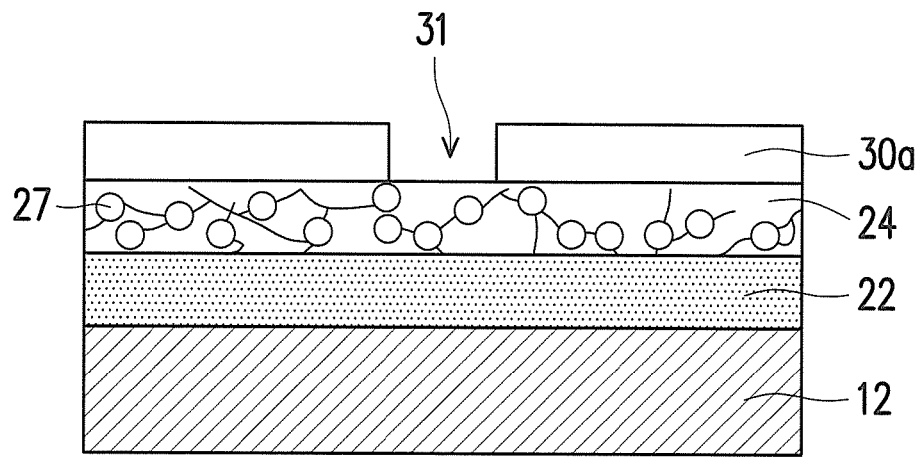

With reference to FIG. 1C and FIG. 1D, an opening 31 is formed in the insulation material layer 30, and a portion of the diffusion barrier material layer 24 is exposed by the opening 31. As a result, a patterned insulation material layer 30a is formed. The process of forming the opening 31 is, for example, forming a patterned mask layer (not illustrated) on the insulation material layer 30 first. Afterwards, etching the insulation material layer 30 by using the patterned mask layer as an etching mask, so as to form the opening 31. This etching process may be an anisotropic etching process, such as a dry etching process. The dry etching process is a plasma etching process, for example.

Figure 1E:
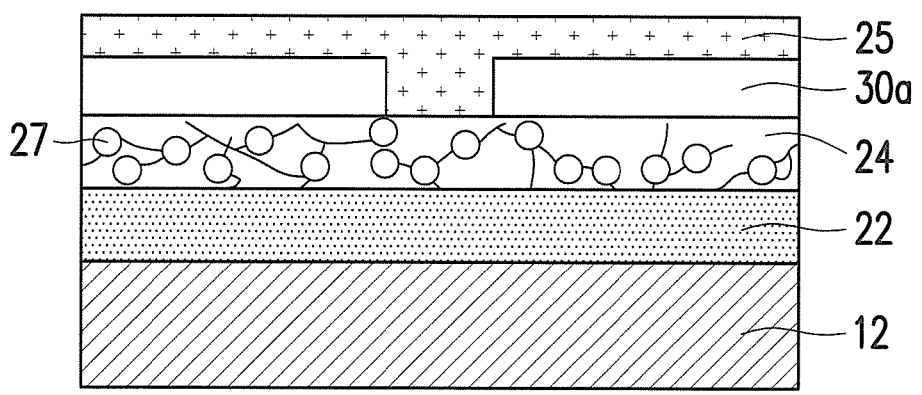

With reference to FIG. 1D and FIG. 1E, a phase change material layer 25 is formed to cover the patterned insulation material layer 30a, and fill the opening 31. A material of the phase change material layer 25 is chalcogenide, for example. In addition, the phase change material layer 25 may be a binary material layer, a ternary material layer, or a multi-element material layer. A material of the binary material layer is, for example, InSb, GaSb, InSe, $Sb_2Te_3$, or GeTe. A material of the ternary material layer is, for example, $Ge_2Sb_2Te_5$, InSbTe, GaSbTe, $SnSbTe_4$, or InSbGe. A material of the multi-element material layer is, for example, AgInSbTe, GeSbTe, SnSbTe, GeSb(SeTe), or $Te_{81}Ge_{15}Sb_2S_2$. A method of forming the phase change material layer 25 is PVD, for example. In an embodiment of the invention, a thickness of the phase change material layer 25 is 25 angstrom to 10000 angstrom.

Figure 1F:
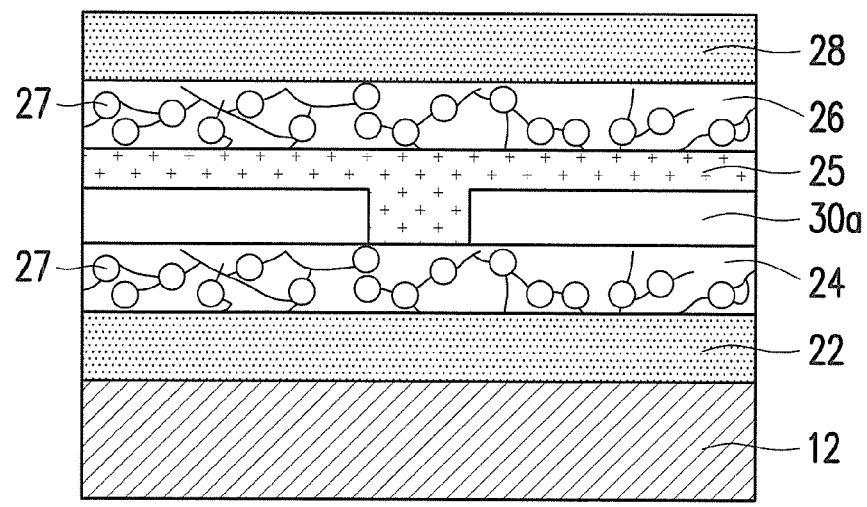

With reference to FIG. 1F, a diffusion barrier material layer 26 is formed on the phase change material layer 25. A material of the diffusion barrier material layer 26 is Ti, Ta, TiN, TaN or a combination thereof, for example. A method of forming the diffusion barrier material layer 26 includes CVD, MOCVD, PVD or ALD, for example. In an embodiment of the invention, a thickness of the diffusion barrier material layer 26 may be 25 angstrom to 2000 angstrom.

Similar to the diffusion barrier material layer 24, barrier enhancing components 27 are provided to the diffusion barrier material layer 26. Thus, the detailed description of the barrier enhancing components 27 is omitted here. The barrier enhancing components 27 are different from constituent elements of the diffusion barrier material layer 26. In an embodiment, the barrier enhancing components 27 are provided into grain boundaries of the diffusion barrier material layer 26. In another embodiment, the barrier enhancing components 27 may be provided on a bottom surface of the diffusion barrier material layer 26, on a top surface of the diffusion barrier material layer 26 or a combination thereof. The barrier enhancing components 27 in the grain boundaries of the diffusion barrier material layer 26 in FIG. 1F are shown for illustrative purpose, but the invention is not limited thereto. In another embodiment, the barrier enhancing components are provided and react with the diffusion barrier material layer 26 to form a barrier enhancing layer (not illustrated) on the bottom surface of the diffusion barrier material layer 26, on the top surface of the diffusion barrier material layer 26 or a combination thereof. In other words, the barrier enhancing components 27 may be on the bottom surface of the diffusion barrier material layer 26, on the top surface of the diffusion barrier material layer 26 or a combination thereof. The barrier enhancing layer may include oxygen element, nitrogen element, helium element or hydrogen element. It is worth noting that the diffusion barrier material layer 26 may be formed and the barrier enhancing components 27 may be provided in an in-situ manner (performed in the same chamber) or an ex-situ manner. The barrier enhancing components 27 are able to enhance the barrier ability of the diffusion barrier material layer 26.

A conductive material layer 28 is formed on the diffusion barrier material layer 26. A material of the conductive material layer 28 is W, TiN, TaN, WN, MoN, NbN, TaSiN, TiAlN, TiBN, ZrSiN, WSiN, WBN, ZrAlN, MoSiN, MoAlN, TaSiN, TaAlN, Ti, W, Mo, Ta, TiSi, TaSi, TiW or WON, for example. A method of forming the conductive material layer 28 includes chemical vapor deposition (CVD), metal organic chemical vapor deposition (MOCVD), physical vapor deposition (PVD) or ALD, for example. In an embodiment of the invention, a thickness of the conductive material layer 28 may be 25 angstrom to 10000 angstrom.

Figure 1G:
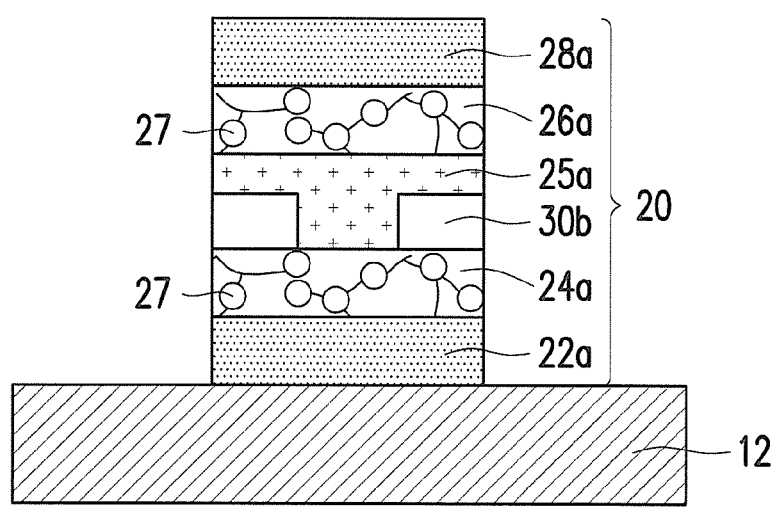

With reference to FIG. 1F and FIG. 1G, a patterned mask layer (not illustrated) is formed on the conductive material layer 28 first. Afterwards, the conductive material layers 28 and 22, the diffusion barrier material layers 26 and 24, the phase change material layer 25, and the patterned insulation material layer 30a not covered by the patterned mask layer are etched, so as to form a stacking structure 20. This etching process may be an anisotropic etching process, such as a dry etching process. The dry etching process is a plasma etching process, for example. The stacking structure 20 comprises conductive layer 28a and 22a, diffusion barrier layers 26a and 24a, a phase change layer 25a, and an insulation layer 30b.

Figure 1H:
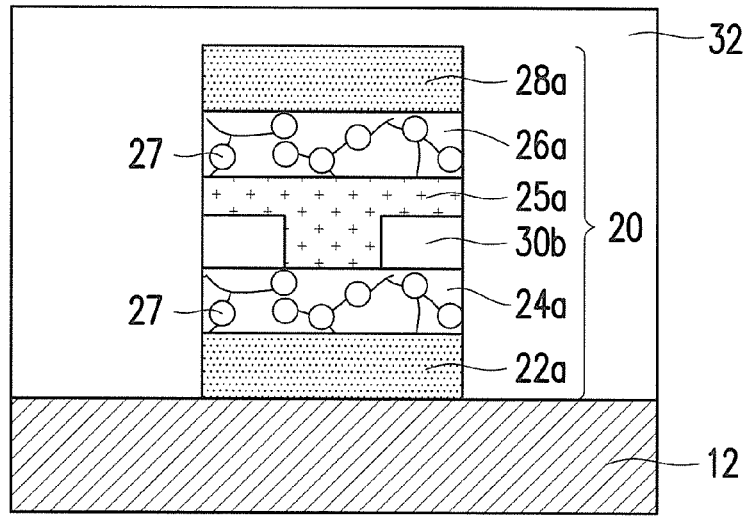

With reference to FIG. 1H, a dielectric material layer 32 covering the stacking structure 20 is formed on the electrode layer 12. A material of the dielectric material layer 32 is silicon oxide, phosphosilicate glass, borophosphosilicate glass, or a combination thereof, for example. A method of forming the dielectric material layer 32 includes CVD, for example.

Figure 1I:
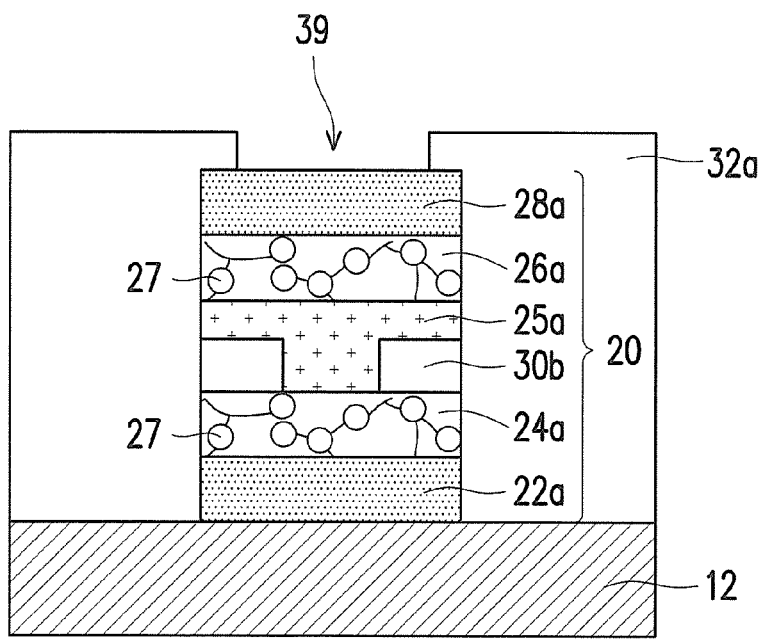

With reference to FIG. 1H and FIG. 1I, an opening 39 is formed in the dielectric material layer 32, and a portion of the conductive layer 28a is exposed by the opening 39. As a result, a dielectric layer 32a is formed. The process of forming the opening 39 is, for example, forming a patterned mask layer (not illustrated) on the dielectric material layer 32 first. Afterwards, etching the dielectric material layer 32 by using the patterned mask layer as an etching mask, so as to form the opening 39. This etching process may be an anisotropic etching process, such as a dry etching process. The dry etching process is a plasma etching process, for example. The dielectric layer 32a covers side walls of the stacking structure 20 and a portion of a top surface of the conductive layer 28a.

Figure 1J:
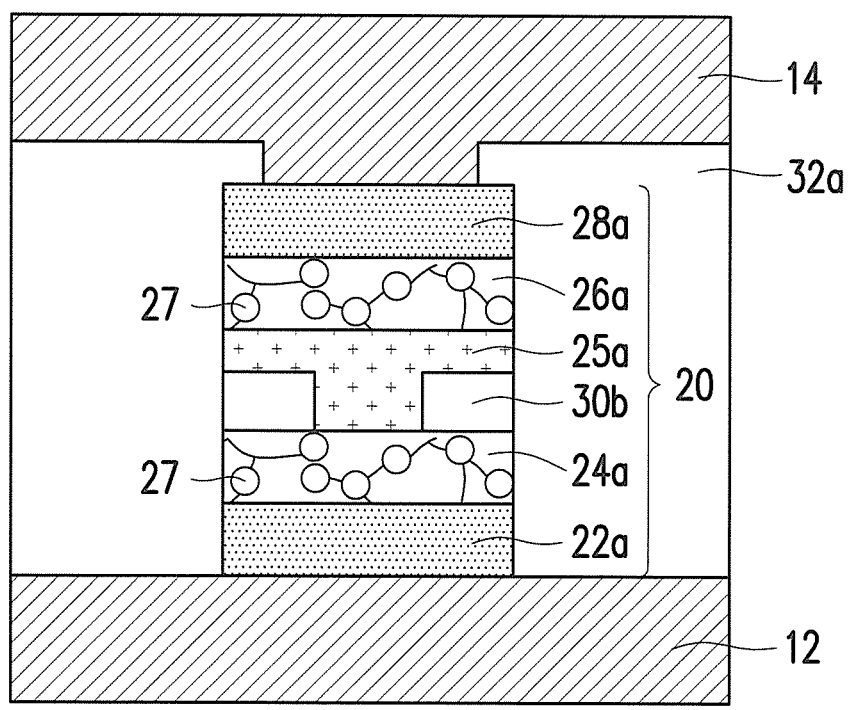

With reference to FIG. 1J, an electrode layer 14 is formed to cover the dielectric layer 32a, and fill the opening 39. The electrode layer 14 is fabricated by metal material, such as tungsten, aluminium, copper or platinum. A method of forming the electrode layer 14 includes atomic layer deposition (ALD), for example. In an embodiment of the invention, a thickness of the electrode layer 14 is 25 angstrom to 10000 angstrom.

Further, with reference to FIG. 1J, the structure of the memory device according to an embodiment of the invention includes the electrode layers 12 and 14, the stacking structure 20, and the dielectric layer 32a. The stacking structure 20 is disposed on the electrode layer 12. More particularly, the stacking structure 20 comprises the conductive layer 22a and 28a, the diffusion barrier layers 24a and 26a, the phase change layer 25a, the insulation layer 30b, and barrier enhancing components 27 provided between a bottom surface of the diffusion barrier layer 24a and a top surface of the diffusion barrier layer 26a. In an embodiment, the barrier enhancing components 27 are provided on grain boundaries of the diffusion barrier layer 24a and grain boundaries of the diffusion barrier layer 26a. In another embodiment, the barrier enhancing components 27 are provided on a bottom surface of the diffusion barrier layer 24a, a top surface of the diffusion barrier layer 24a, a bottom surface of the diffusion barrier layer 26a, a top surface of the diffusion barrier layer 26a or a combination thereof. In another embodiment, the barrier enhancing components 27 may be contained in the barrier enhancing layer (not illustrated) on the bottom surface of the diffusion barrier layer 24a, a top surface of the diffusion barrier layer 24a, a bottom surface of the diffusion barrier layer 26a, the top surface of the diffusion barrier layer 26a or a combination thereof. Besides, the barrier enhancing components 27 are different from constituent elements of the diffusion barrier layers 26a and 24a. The barrier enhancing components 27 include oxygen element, nitrogen element, helium element or hydrogen element, for example. The dielectric layer 32a is disposed on the electrode layer 12. In addition, the dielectric layers 32a covers side walls of the stacking structure 20 and a portion of the top surface of the conductive layer 28a. The electrode layer 14 covers the dielectric layer 32a, and a portion of the top surface of the conductive layer 28a. In other words, the stacking structure 20 and the dielectric layer 32a are located between the electrode layers 12 and 14.

To conclude the above, the manufacturing method of the memory device provided by the invention includes providing barrier enhancing components to the diffusion barrier layers between the conductive layers and the phase change layer to improve the barrier ability, so as to effectively prevent the unexpected metal diffusion from the conductive layers into the phase change layer, thereby improving the reliability of the memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a memory device, comprising:
    forming a first conductive layer, a first diffusion barrier layer, a phase change layer, a second diffusion barrier layer and a second conductive layer in sequence on a first electrode layer to form a stacking structure,
    providing a plurality of barrier enhancing components to the stacking structure, so that the barrier enhancing components are provided between a bottom surface of the first diffusion barrier layer and a top surface of the second diffusion barrier layer;
    forming a dielectric layer on the first electrode layer, wherein the dielectric layer covers a sidewall of the stacking structure and part of a top surface of the second conductive layer; and
    forming a second electrode layer on the dielectric layer and the second conductive layer,
    wherein the first diffusion barrier layer and the second diffusion barrier layer respectively comprise Ti, Ta, TiN, TaN or a combination thereof.

2. The method according to claim 1, wherein the barrier enhancing components are different from constituent elements of the first diffusion barrier layer and the second diffusion barrier layer.

3. The method according to claim 2, wherein the barrier enhancing components comprise oxygen element, nitrogen element, helium element or hydrogen element.

4. The method according to claim 1, wherein the barrier enhancing components are provided on grain boundaries of the first diffusion barrier layer, grain boundaries of the second diffusion barrier layer, the bottom surface of the first diffusion barrier layer, a top surface of the first diffusion barrier layer, a bottom surface of the second diffusion barrier layer, the top surface of the second diffusion barrier layer or a combination thereof.

5. The method according to claim 1, wherein the barrier enhancing components are contained in a barrier enhancing layer on the bottom surface of the first diffusion barrier layer, a top surface of the first diffusion barrier layer, a bottom surface of the second diffusion barrier layer, the top surface of the second diffusion barrier layer or a combination thereof.

6. The method according to claim 5, wherein the barrier enhancing layer comprises oxygen element, nitrogen element, helium element or hydrogen element.

7. The method according to claim 1, wherein the first diffusion barrier layer and the second diffusion barrier layer are formed and the barrier enhancing components are provided in an in-situ manner.

8. The method according to claim 1, wherein the first diffusion barrier layer and the second diffusion barrier layer are formed and the barrier enhancing components are provided in an ex-situ manner.

9. The method according to claim 1, wherein the barrier enhancing components are provided by performing a rapid thermal oxidation process, an oxygen plasma process, or a furnace oxidation process.

10. The method according to claim 1, further comprising forming an insulation layer on the first diffusion barrier layer, wherein an opening is formed in the insulation layer, and the phase change layer covers the insulation layer and fills the opening.

* * * * *